United States Patent
Canada et al.

(10) Patent No.: US 6,297,742 B1
(45) Date of Patent: *Oct. 2, 2001

(54) MACHINE MONITOR WITH STATUS INDICATOR

(75) Inventors: Ronald G. Canada, Knoxville; Eugene F. Pardue, Lenoir City; James C. Robinson, Knoxville, all of TN (US)

(73) Assignee: CSI Technology, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/073,754

(22) Filed: May 6, 1998

Related U.S. Application Data

(63) Continuation-in-part of application No. 08/915,069, filed on Aug. 20, 1997, which is a continuation-in-part of application No. 08/697,335, filed on Aug. 22, 1996, now Pat. No. 5,726,911.

(51) Int. Cl.[7] .................................................. G08B 21/00
(52) U.S. Cl. ......................... 340/635; 340/679; 340/683; 361/23; 318/490
(58) Field of Search ..................................... 340/635, 680, 340/679, 683, 870.09, 870.16, 870.17, 539; 318/471, 473, 490; 702/56, 132; 361/23

(56) References Cited

U.S. PATENT DOCUMENTS

| | | | |
|---|---|---|---|
| 3,852,730 | * 12/1974 | Commins | 340/681 |
| 4,194,178 | 3/1980 | Dumbeck | 340/201 |
| 4,237,454 | * 12/1980 | Meyer | 340/682 |
| 4,258,421 | 3/1981 | Juhasz et al. | 364/424 |
| 4,495,448 | 1/1985 | Dumbeck | 318/54 |
| 4,520,674 | 6/1985 | Canada et al. | 73/660 |
| 4,525,763 | 6/1985 | Hardy et al. | 361/24 |
| 4,575,803 | 3/1986 | Moore | 364/551 |
| 4,622,538 | * 11/1986 | Whynacht et al. | 340/506 |
| 4,659,976 | 4/1987 | Johnson | 318/332 |
| 4,823,067 | 4/1989 | Weber | 318/799 |
| 4,839,830 | 6/1989 | Amey et al. | 364/551.01 |
| 5,019,760 | 5/1991 | Chu et al. | 318/490 |
| 5,115,671 | * 5/1992 | Hicho | 73/488 |
| 5,189,350 | 2/1993 | Mallett | 318/473 |
| 5,323,325 | 6/1994 | Izumiya | 364/474.16 |
| 5,450,321 | 9/1995 | Crane | 364/424.04 |
| 5,473,229 | 12/1995 | Archer et al. | 318/254 |
| 5,509,310 | * 4/1996 | El-Ibiary | 73/660 |
| 5,554,900 | 9/1996 | Pop, Sr. | 310/156 |
| 5,633,811 | 5/1997 | Canada et al. | 364/576 |
| 5,666,010 | * 9/1997 | Stratiotis | 307/328 |
| 5,703,295 | * 12/1997 | Ishida | 340/683 |
| 5,726,911 | * 3/1998 | Canada | 364/550 |

FOREIGN PATENT DOCUMENTS

| | | |
|---|---|---|
| 2681942 | 9/1991 | (FR) . |
| 2673777 | 3/1992 | (FR) . |

* cited by examiner

Primary Examiner—Jeffery Hofsass
Assistant Examiner—Anh La
(74) Attorney, Agent, or Firm—Luedeka, Neely & Graham, P.C.

(57) ABSTRACT

A monitor attaches to a machine or proximate a machine to determine the health and operating status of the machine. The monitor is preferably self-contained, having its own internal power source, electronics, and sensor suite. One or more sensors are provided to sense machine operating characteristics such as temperature, flux, and vibration. Sensor outputs are processed and analyzed by monitor electronics to determine various operating parameters, including machine speed and load, and to determine when an anomalous machine operating condition is present. Monitor electronics are operable to transform time domain data generated by the sensors to frequency domain data for storage and/or analysis. A communications port enables a peripheral device, such as a notebook computer or portable data collector, to communicate with the monitor and download stored data. Downloaded data can be further analyzed and statistically compared to trend data at a base computer to further ascertain the health and condition of the machine.

20 Claims, 8 Drawing Sheets

MACHINE MONITOR WITH STATUS INDICATOR

TECHNICAL FIELD

This is a continuation-in-part of pending application Ser. No. 08/915,069, filed Aug. 20, 1997, which is a continuation-in-part of application Ser. No. 08/697,335, filed Aug. 22, 1996, which issued as U.S. Pat. No. 5,726,911 on Mar. 10, 1998.

The present invention relates generally to a machine monitor. More particularly, the present invention relates to a self-contained machine monitor which attaches to a mount proximate a machine to sense machine operating parameters, to determine machine status based on the sensed operating parameters, and to indicate either visually or aurally, or both, the status of the machine.

BACKGROUND

Electric motors, particularly ac induction motors, are employed in many industrial and manufacturing facilities. Among their many applications, ac induction motors are used to provide power to machinery in manufacturing facilities. Downtime caused by a failure of an electric motor reduces productivity and profitability. Electric motors, therefore, are important elements of industrial facilities and their health and condition must be closely observed to prevent motor failures that result in costly unscheduled downtime.

Evaluating the extent of stator wire insulation degradation has long been considered an effective way of determining the condition of an electric motor. As the motor ages, insulation breakdown occurs due to high motor temperature and other operating stresses. When insulation degradation reaches a critical point, the motor windings short circuit, thereby resulting in motor failure.

Attempts have been made in the art to provide electric motor monitoring systems capable of monitoring the condition of the motor. Many of these systems focus on determining the amount of insulation degradation as a way of predicting the remaining useful life of the motor. For example, in U.S. Pat. No. 5,019,760 to Chu et al., a system is disclosed for continuously determining the consumed life of electrical motor winding insulation. Insulation degradation is calculated as a function of insulation thermal properties, insulation temperature, and motor power rating. The temperature of the insulation is measured over a time interval, and the average winding temperature is used to calculate a consumed life of the insulation for that time interval. The consumed life values calculated for each time interval are then summed to determine a total consumed life of the motor.

In U.S. Pat. No. 5,189,350 to Mallett, there is described a monitoring system for an electric motor. A temperature sensor monitors the operating temperature of the motor. A memory is provided for storing the "absolute maximum operating temperature" and a "predetermined maximum permitted operating temperature" of the motor. An indicator is used for indicating the sensed motor temperature as lying within either a safe, hazardous, or dangerous range as determined by comparison of the sensed motor temperature to the stored maximums. A recorder stores the number of times the motor has operated beyond the predetermined maximum permitted operating temperature and the number of times the motor has operated beyond the absolute maximum operating temperature.

In U.S. Pat. No. 4,525,763 to Hardy et al., a system for predicting the remaining useful life of an electric motor is described. Hardy utilizes motor temperature and past history to determine the amount of insulation degradation, which forms the basis of the remaining useful life prediction. The predicted remaining useful life is displayed and may be used to issue a warning or to trip circuit breakers supplying power to the motor when projected life is shorter than predicted life.

While high motor temperature, and resultant insulation degradation can contribute to electric motor failures, it is not the only factor. There are many complex and interrelated operating characteristics of electric motors that affect the health and longevity of the motor. Factors such as motor speed, loading, vibration, and the number of motor starts/stops also affect motor life. However, all known electric motor monitors today are incapable of monitoring these operating characteristics in an efficient, productive manner.

Known prior art devices do not adequately address multiple contributing factors to motor failure, maintenance issues for an electric motor monitoring system itself, enhancing the useability of a monitoring system, or providing a monitoring system that can be applied in a cost effective manner.

What is needed, therefore, is an electric motor monitor capable of sensing and analyzing various stresses experienced by the motor during the life of the motor, including temperature, and storing these stress data as the operation history of the motor. The monitor should be configured to allow stored data to be easily downloaded for archival or further analysis. For purposes of maintainability and affordability, the monitor should be relatively small and self-contained with its own internal power source, and capable of being mounted directly to the motor. Finally, with the monitor mounted directly to the motor, it should be rugged and capable of withstanding the rigors of a harsh industrial environment.

SUMMARY

With regard to the foregoing and other objects, the invention provides a monitor for being placed in sensory contact with a machine for monitoring the operation of the machine and producing an operation history. The monitor includes a structural enclosure with an engagement surface. A fastener is used to attach the engagement surface to a mount proximate the machine so that the engagement surface is in sensory contact with the machine. A power supply supplies electrical power to the monitor. A sensor, such as a vibration transducer, is disposed in the enclosure to sense an operating parameter of the machine and to produce sensor signals representative of the operating parameter that was sensed. A signal processor is disposed in the enclosure to receive, process, and analyze the sensor signals to produce sensor data corresponding to the operating status of the machine. When analysis of the sensor signals indicates the existence of an anomalous machine condition, an alarm signal is produced. An indicator receives the alarm signal and produces a humanly perceivable indication of an anomalous machine operating condition. Memory is provided for storing operational programming for use by the processor and sensor data produced by the processor.

In a further aspect of the invention, the processor is operable to perform a fast Fourier transform of the sensor signals to produce machine operating data in the form of spectra. The processor then analyzes the spectra to determine machine condition.

In another aspect, the indicator is a visual indicator which provides machine operators with a visual indication corresponding to the operating condition of the machine based on the presence or absence of alarm signals. The severity of an anomalous condition can be indicated as well. Alternatively, the indicator may take the form of an aural indicator which produces an aural indication of the machine's operating condition.

The monitor may further include a communications module to enable the monitor to communicate with a peripheral device for data transfer and programming. For example, the communications module may be an infrared data port or an RF communications module.

The monitor may be attached in a variety of ways. For example, the fastener may include a threaded stud attached to the outer surface of the machine. A recess formed in the monitor enclosure is threaded to receive the stud so that when the recess and stud are adjacent one another, rotation of the monitor in a first direction attaches the monitor to the stud. To disengage the monitor from the machine, the monitor is rotated in an opposite direction. As another example, an adhesive may be used to attach the monitor to the outer surface of the machine.

The present invention also provides a machine fault detection and indicator system for monitoring the operating condition of a plurality of machines and indicating when one or more anomalous machine conditions are detected. For each machine being monitored, the system includes at least one monitor in sensory contact with the machine to sense and analyze an operating characteristic of the machine. When an alarm signal is produced, the monitor indicates to machine operators the presence and preferably the severity of the anomalous operating condition. The system further includes a peripheral device for obtaining machine operating data from a monitor when an anomalous machine condition is indicated.

The system may further include a base computer for receiving and analyzing the machine operating data to produce diagnostic information corresponding to causal factors of the anomalous condition.

The present invention also provides a method for monitoring a machine for anomalous conditions. The method includes the steps of permanently attaching a monitor to a machine so that the monitor remains attached to the machine for extended periods of time. The monitor senses one or more operating characteristics of the machine and produces sensor signals corresponding to the sensed characteristics. The sensor signals are analyzed by the monitor to determine the operating condition of the machine, and the existence of an alarm condition is indicated to machine operators when the monitor determines that such a condition exists.

BRIEF DESCRIPTION OF THE DRAWINGS

The preferred embodiments of the invention will now be described in further detail with reference to the drawings wherein like reference characters designate like or similar elements throughout the several drawings as follows.

DETAILED DESCRIPTION OF PREFERRED EMBODIMENTS

Figure 1:
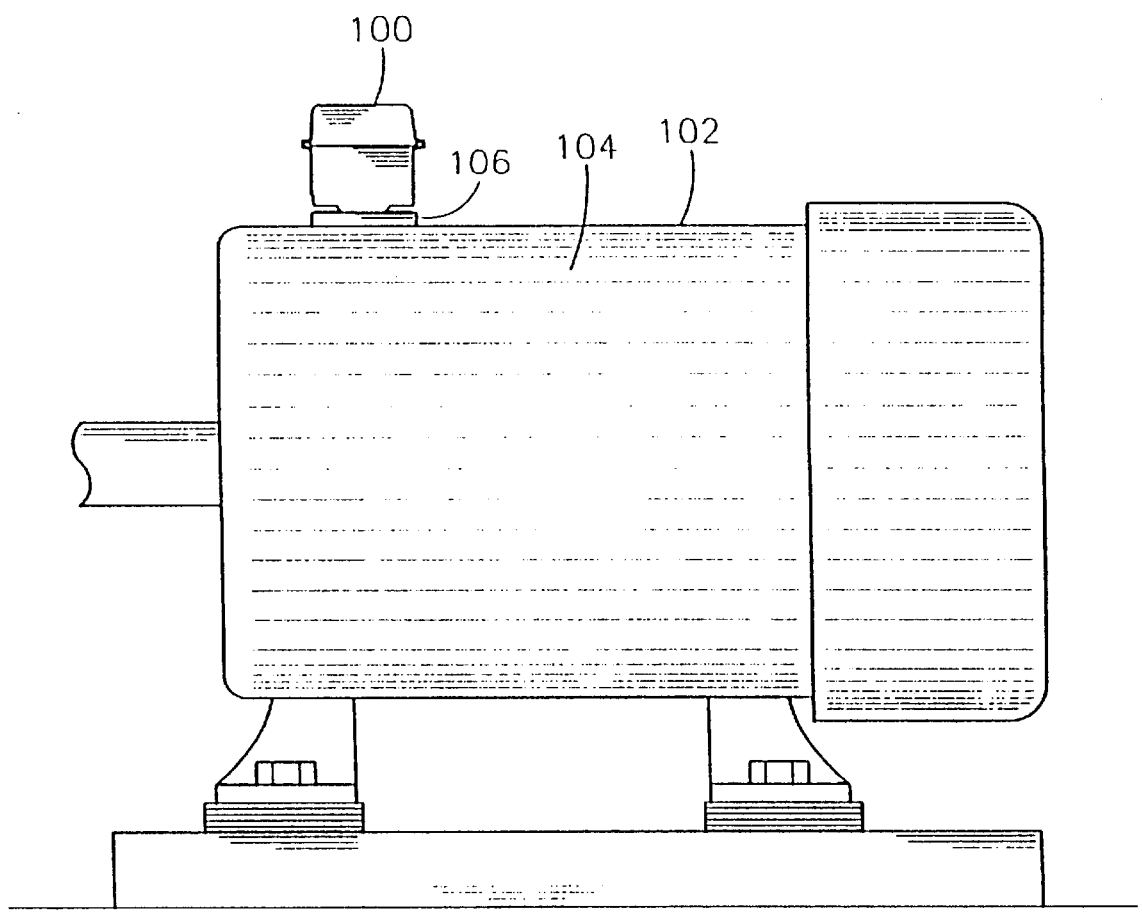
FIG. 1 is a side view of an ac induction motor with a monitor of the present invention attached to the motor by means of a mounting plate.

In accordance with a preferred embodiment of the present invention shown in FIG. 1, a motor monitor 100 capable of sensing, analyzing, storing, and outputting various motor operating data is attached externally to the frame 104 of a large industrial electrical machine, such as an ac induction motor 102. Alternately, the monitor 100 may be attached to an ac generator for sensing and recording various life history parameters of the generator. The monitor 100, which is fully self-contained in sensors, data acquisition, and power, is small in comparison to the size of the motor 102 and mounted so as not to interfere with the operation of the motor 102.

Figure 2:
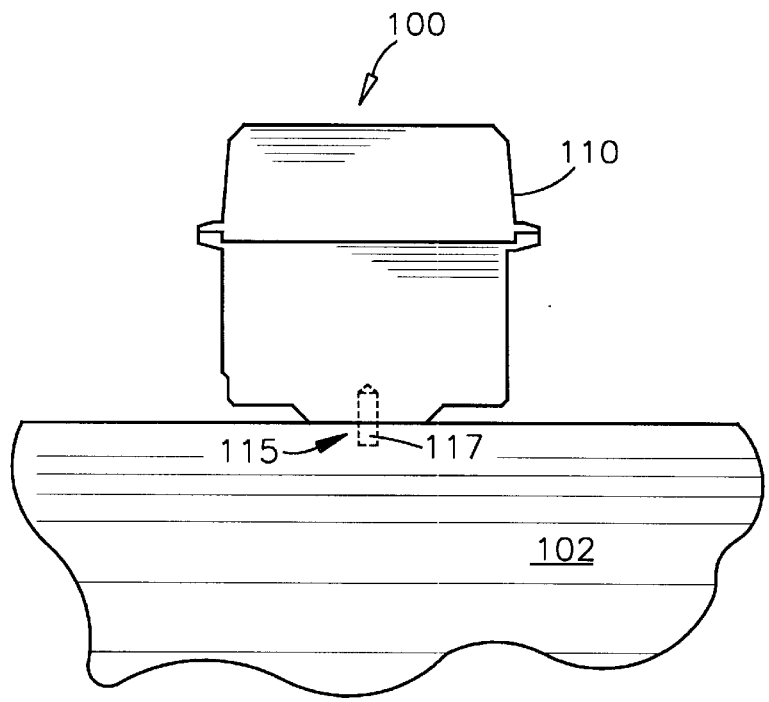
FIG. 2 is a sectional view of an electric motor monitor attached to an electric motor by means of a bolt threaded into the lifting eye bolt hole of the motor.

In order to provide consistent, reliable motor operating data, the monitor 100 should be capable of withstanding the environmental conditions typically experienced by an electric motor 102, including mechanical shock, temperature, and contamination from such materials as oil and water. As shown in FIG. 2, the monitor 100 consists of a ruggedized housing 110 capable of withstanding the typically harsh environments of industrial facilities. Electronics and sensors within the monitor 100 are sealed and protected by the housing 110 so that the monitor 100 may be mounted in exterior and wet environments.

Figure 3:
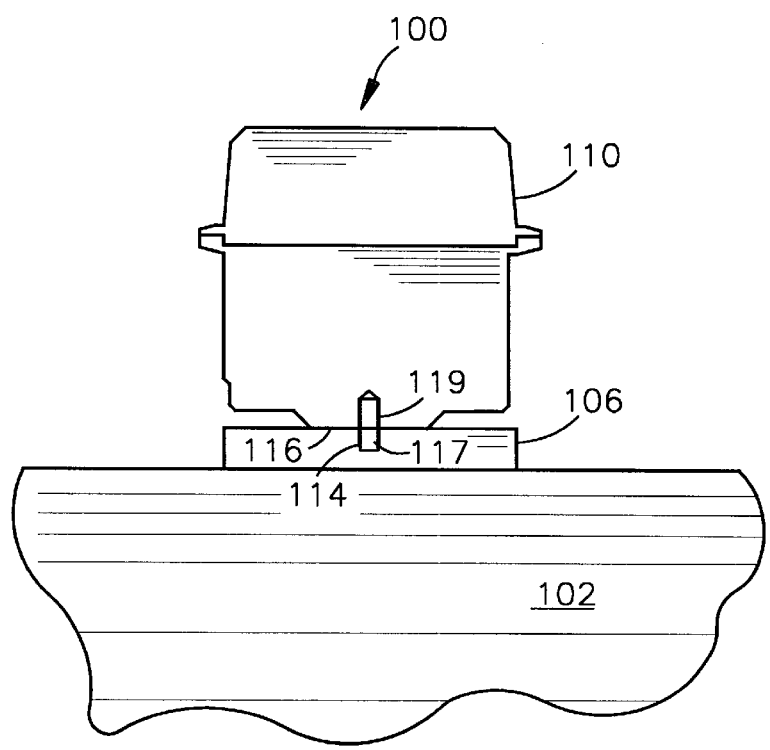
FIG. 3 is a sectional view of the motor monitor and mounting plate of FIG. 1.

Although the monitor 100 may be attached by any suitable attachment means, including bolts, screws, rivets, quick release fasteners, welding, adhesives, and magnets, a preferred means of attaching the monitor 100 to the motor 102 is shown in FIG. 1. A mounting plate 106 is secured to the motor frame 104 by bolts (not shown). Alternatively, the mounting plate 106 is attached to the frame 104 by an epoxy adhesive. As FIG. 3 illustrates, the mounting plate 106 includes a threaded recess 114 into which a threaded stud 117 is positioned. The stud 117 is of sufficient length to protrude above the plate 106 as shown. At the base of the monitor 100 is an engagement surface 116 that includes a threaded recess 119 sized to receive the stud 117. After mounting plate 106 is attached to the motor 102 and the stud 117 positioned within recess 114, the monitor 100 is then threaded onto that portion of stud 117 that protrudes above the mounting plate 106 so that the engagement surface 116 contacts the mounting plate 106. Thus, the monitor 100 attaches to a mount proximate the motor 102.

Referring again to FIG. 2, an alternate means of attaching the monitor 100 to the motor 102 is illustrated. The mounting plate 106 is eliminated in FIG. 2 and stud 117 is instead threaded into an existing motor lifting eye bolt hole, shown generally at 115. For the attachment methods illustrated in FIGS. 2 and 3, attachment of the monitor 100 to the motor 102 can be accomplished by hand. No tools are needed.

The monitor 100 may be conceptually viewed as a device that provides a function somewhat similar to the function provided by the odometer of an automobile. An automobile odometer provides the operator with information relating to how many total miles the vehicle has been driven. The mileage indicated by the odometer is used by the operator, and others, as a single measure of the general health and condition of the automobile. Preventive maintenance, component life, and even the worth of an automobile are usually established by this single parameter (i.e., mileage). Because of the complexity and interrelationship of factors that effect the condition of electric motors, the health of an electric motor generally cannot be determined by a single parameter. For example, the following factors have been determined to affect the life of an electric motor:

1. Total run time (in hours);
2. Run time at various motor loading conditions;
3. Motor temperature;
4. Ambient temperature;
5. Number of starts and stops;
6. Motor vibration;
7. Balance and alignment of the motor;
8. Temperature history of the windings; and
9. Efficiency of the motor. In a preferred embodiment, the monitor 100 of the present invention senses, collects, analyzes, and stores information useful for ascertaining the health and condition of electric motors based on these factors. Although it is preferable to incorporate within the monitor 100 the capability to analyze sensor data and determine the motor's operating condition, such as by Fourier transform or preferably by fast Fourier transform (FFT), it is not required. If desired, the monitor 100 may be used simply as a device that senses and stores various operating characteristics with little or no analysis of the data performed within the monitor 100 itself. The stored sensor data could be downloaded to a base computer for analysis and archival.

Figure 4:
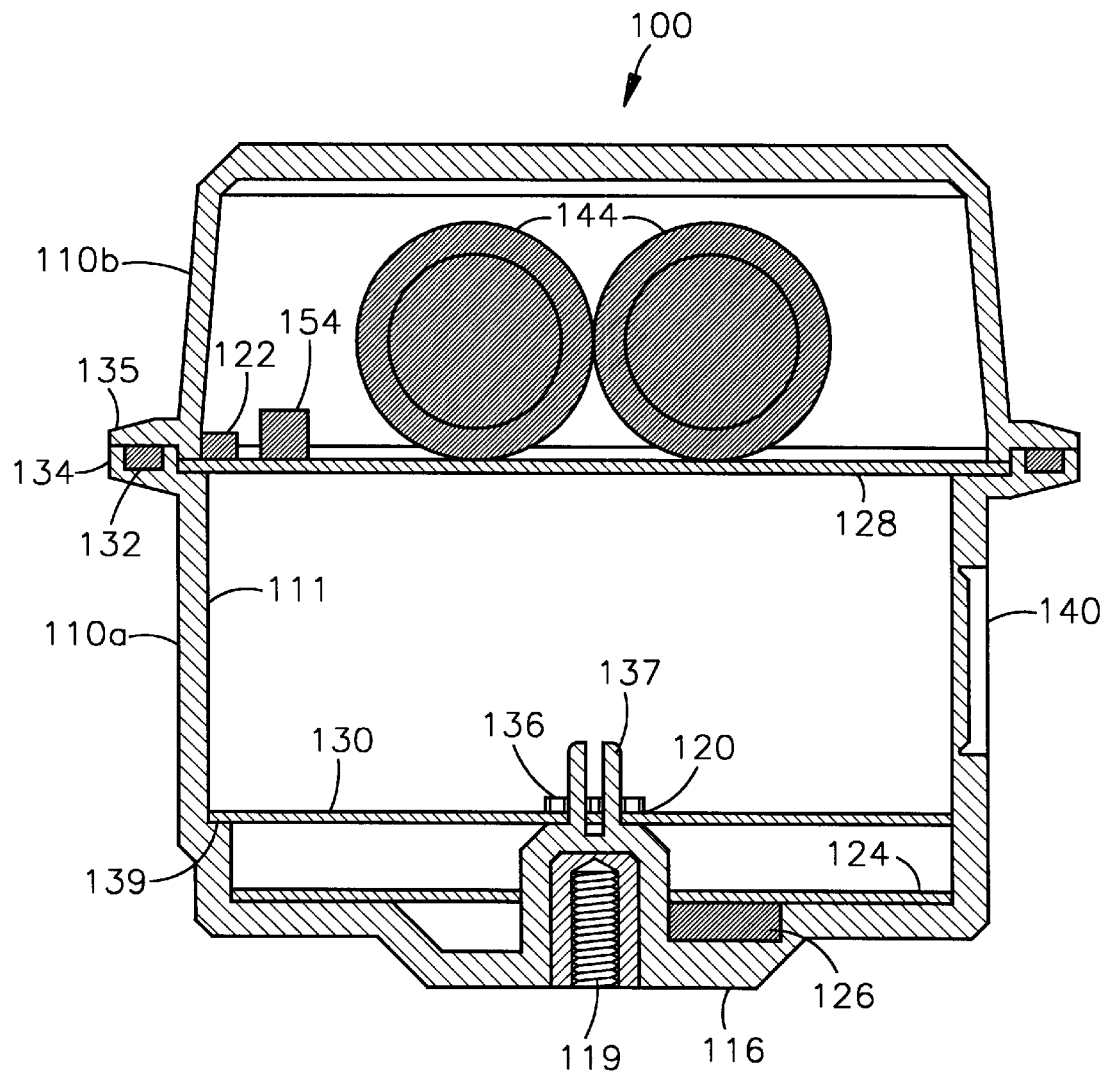
FIG. 4 is a cross-sectional view of the monitor of FIGS. 1 and 2.

As illustrated in the cross-sectional view of FIG. 4, the housing 110 of the monitor consists of a bucket 110a that is covered by lid 110b. At the top of the bucket 110a is an annular flange 134 which joins with a corresponding annular flange 135 formed at the bottom of the lid 110b. The bucket 110a and lid 110b are secured to each other by one or more clamps (not shown) which hold flanges 134, 135 in compression. Set within a channel formed in flange 134 is a rubber O-ring 132 to prevent intrusion of moisture and other contaminants at the interface of flanges 134, 135.

Figure 5:
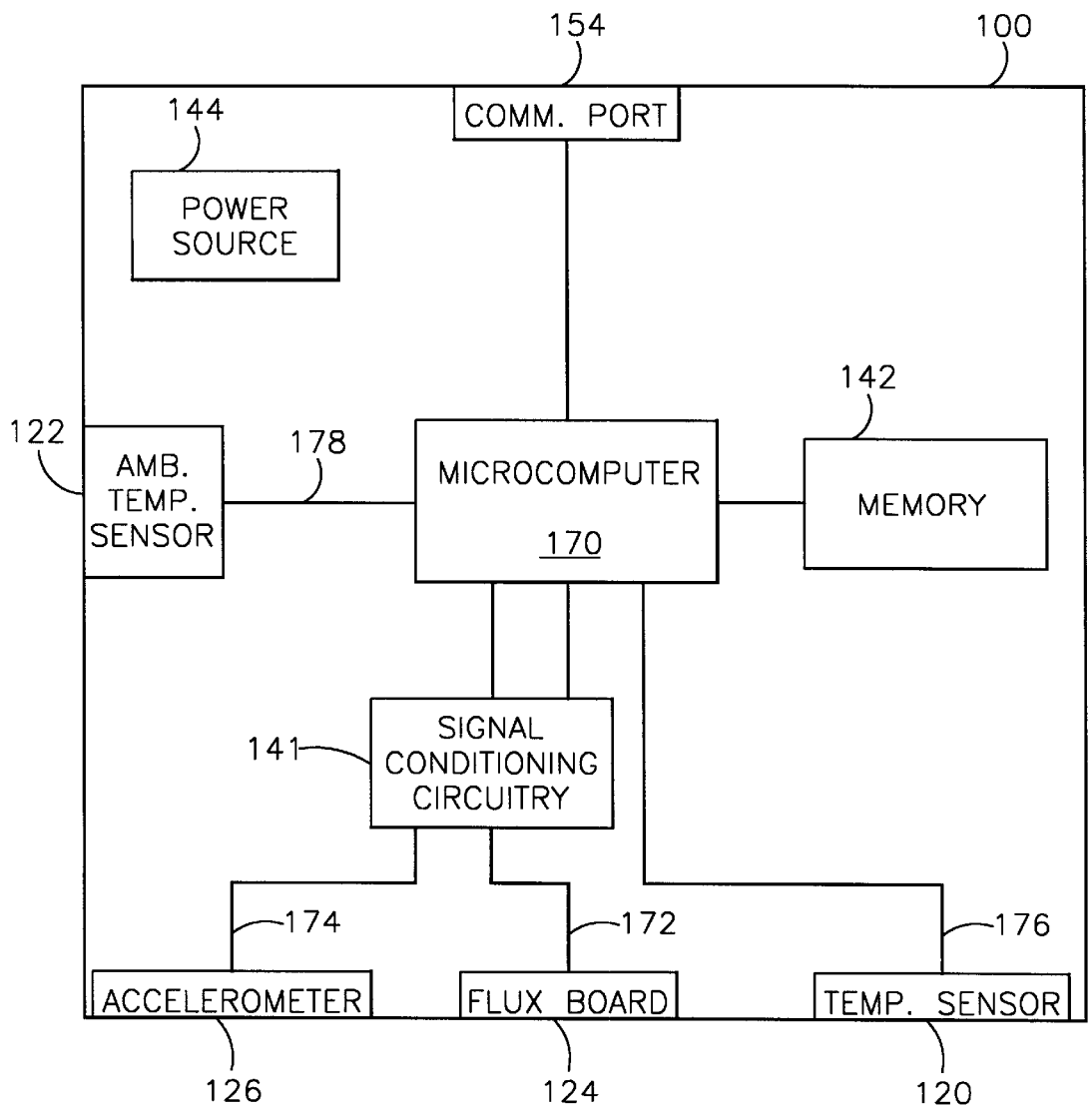
FIG. 5 is a functional block diagram of a preferred embodiment of monitor electronics and sensors.

As can be seen in FIG. 4, the engagement surface 116 extends beyond the base of the bucket 110a to elevate the monitor 100 and help reduce thermal conductivity between the motor 102 and monitor 100. As FIG. 4 illustrates, and with further reference to the functional block diagram of FIG. 5, sensors within the monitor 100 are preferably mounted at or near the engagement surface 116 at the base of the monitor 100. When the monitor 100 is threaded into the eye bolt hole 115 (FIG. 2) or mounting plate 106 (FIGS. 1 and 3), the sensors establish contact with the motor frame 104 through the engagement surface 116 so that temperature, flux, and vibrations produced by the motor 102 can be detected more readily.

Sensors positioned at the base of the monitor 100 for sensing various parameters of the motor 102 during operation include a motor frame temperature sensor 120, a magnetic flux sensor 124 for sensing motor flux, and a radial vibration transducer 126 for sensing motor vibrations generated by the motor 102 and transmitted through the motor frame 104. In addition to the sensors at the base of the monitor 100, an ambient temperature sensor 122 is mounted on top of a removable shelf 128 that is held in compression between the bucket 110a and lid 110b as shown. In a preferred embodiment, flux sensor 124 is a specially designed board of substantially circular dimension adhesively secured to the bottom of the bucket 110a. A metal trace deposited onto the board in a spiral pattern serves as the flux sensing element.

Although a preferred embodiment of the monitor 100 incorporates sensors within the monitor 100, it will be understood that sensors may be located external to the monitor 100 as well. For example, flux and vibration sensors may be incorporated within the motor 102, and at various locations within the motor 102. The outputs from these external sensors are interfaced with the monitor 100 by wires or by wireless means, such as infrared data link.

Outputs from sensors 122, 124, and 126 are electrically connected to an electronics board 130 where the sensor outputs are processed and stored as motor operating parameters. Two D cell batteries 144, which provide a source of dc electrical power for the monitor 100, are secured to shelf 128. Equipment that is secured to shelf 128, including batteries 144, ambient temperature sensor 122, and infrared communications port 154, are electrically connected to the electronics board 130 via a ribbon cable. Motor frame temperature sensor 120 is attached directly to the electronics board 130.

As shown in FIG. 4, the electronics board 130 is positioned immediately above the flux sensor board 124. A press nut 136 and associated hold down fitting 137 secures the electronics board 130 in place.

Additional provisions are made for the attachment of a remote temperature sensor (not shown) to the electronics board 130 for measuring, for example, internal stator temperature. Formed in the wall of the bucket 110a is a knockout section 140. To connect a remote temperature sensor to the electronics board 130, the knockout section 140 is removed and a conduit fitting is attached in its place. Electrical connection between the remote sensor and board 130 is then provided via one or more electrical conductors routed through a conduit attached to the conduit fitting. The remote temperature sensor, when used, enables the user to measure internal stator temperature so that stator temperature increase can be determined from trend data.

Outputs from all sensors are processed and stored by electronics contained on the electronics board 130. As illustrated in the functional block diagram of FIG. 5, the electronics include analog signal conditioning circuitry 141 for amplifying and frequency filtering flux and vibration signals, a microcomputer 170 programmed to control the processing and storage of sensor data, and a memory 142 for storing sensor data. In an alternate embodiment, the functions provided by the signal conditioning circuitry 141 are performed by the microcomputer 170. An electrical power source 144 provides all electrical power for the monitor 100. It will be understood that, for purposes of simplifying the block diagram illustration of FIG. 3, all connections to the power source 144 are omitted.

In operation, flux board 124 senses magnetic flux produced by the motor 102 and outputs an electrical signal corresponding to sensed flux on line 172. Flux board 124 measures motor leakage flux much like an antenna. Significant information about the motor's condition can be determined from the flux signal, including running or stopped status, motor speed and load (computed from slip), and startup acceleration time. In addition, by performing a high resolution Fourier transform of the flux signal, preferably a fast Fourier transform (FFT), one can determine voltage phase imbalance, stator turn to turn shorts, and rotor bar condition.

Motor life factors (including motor run time, motor load and cumulative run time in various load ranges, motor starts, and the time required for a starting motor to reach operating speed) are computed from the sensor signals. In addition, several motor electrical condition indicators are measured from a high resolution flux spectrum. Voltage phase imbalance, stator condition, and rotor condition are measured as relative, trendable parameters. By obtaining a measured current spectrum for the motor at full load, a calibration and severity indication of these relative values can be determined.

Motor vibrations sensed by vibration transducer 126 are converted into a corresponding electrical signal and output on line 174. Preferably, the vibration signals are transformed from the time domain to the frequency domain by the monitor 100 using Fourier transform or fast Fourier transform (FFT) to produce information corresponding to motor operating parameters. From this sensor, the monitor 100 can determine the following parameters:

1. Overall vibration;
2. Subharmonics;
3. 1X;
4. 2X;
5. High frequency in acceleration units;
6. 3X–8X synchronous energy;
7. 1X–8X nonsynchronous energy;
8. >8X synchronous energy; and
9. >8X nonsynchronous energy. From this set of vibration parameters, mechanical faults are detected including imbalance, looseness, bearing degradation, oil instability in sleeve bearings, resonances, and others. The cumulative time the motor spends in each of three general vibration ranges (low, medium, and high) is also tracked.

The frame temperature sensor 120 outputs an electrical signal on line 176 corresponding to the temperature of the motor frame 104, and ambient temperature sensor 122 outputs an electrical signal on line 178 corresponding to ambient temperature. The difference between the two temperatures is the motor heating. The microcomputer 170 receives each of the sensor signals on lines 172–178, processes and analyzes the signals, and stores the processed signals. The monitor 100 tracks ambient temperature, motor frame temperature, and motor heating as trendable parameters, as well as the cumulative amount of time motor heat resides in three temperature ranges (low, medium, and high). Temperature profile investigations of a motor's external frame 104 shows the hottest points on a motor are midway between front and back on the side or top of the motor. Typically, open frame motors show a maximum external temperature range between 35° C. and 50° C. Totally enclosed motors typically range between 40° C. and 60° C. These temperature ranges are considered normal.

A general rule of temperature effect on motor reliability is that a long term 10° C. rise in stator temperature cuts a motor's life in half. There are many factors which can cause a motor to run hot, including:

1. Over or under voltage;
2. Frequency deviation from 60 Hz;
3. Voltage imbalance;
4. Harmonic content;
5. Altitude derating;
6. High ambient temperature (>40° C.);
7. Dirty or blocked cooling passages; and
8. Excessive load. All of these factors result in an increase in motor heating and a significant reduction in motor life.

Data is first stored within the microcomputer's internal random access memory (RAM). Data stored in RAM is then periodically transferred to an external memory device 142, such as an electrically erasable programmable read only memory (EEPROM), for longer term storage.

From the sensor outputs, many different types and formats of motor operating parameters and information can be measured and/or calculated. For example, the cumulative run time of the motor 102 can be determined and stored for the life of the motor 102. In addition, if the user wanted to know the cumulative run time of the motor 102 for the past 30 month period, that information can be determined and stored as well. Table 1 illustrates the types and formats of parameters that are determined and stored in a preferred embodiment of the invention, where the leftmost column identifies various parameters that are measured, the middle column identifies the measurement period(s) for each parameter, and the rightmost column identifies the interval at which parametric measurements are acquired.

TABLE 1

| PARAMETER | MEASUREMENT | ACQUISITION INTERVAL |
|---|---|---|
| Motor Life Parameters | | |
| 1. Run time | 180 days, 60 months, life | 1 minute |
| 2. Starts | 180 days, 60 months, life | 1 minute |
| 3. Starting time | 180 days, 60 months, life | 1 minute |
| 4. Light load time 0–75% | 180 days, 60 months, life | 1 minute |
| 5. Rated load time 76–105% | 180 days, 60 months, life | 1 minute |
| 6. High load time >106% | 180 days, 60 months, life | 1 minute |
| 7. Low motor heating time | 180 days, 60 months, life | 1 minute |
| 8. Mid motor heating time | 180 days, 60 months, life | 1 minute |
| 9. High motor heating time | 180 days, 60 months, life | 1 minute |
| 10. Low vibration time | 180 days, 60 months, life | 1 minute |
| 11. Mid vibration time | 180 days, 60 months, life | 1 minute |
| 12. High vibration time | 180 days, 60 months, life | 1 minute |
| Trend Parameters | | |
| 13. Motor frame temperature | maximum, average | 1 minute |
| 14. Ambient temperature | maximum, average | 1 minute |
| 15. Motor heating (Frame-ambient) | maximum, average | 1 minute |
| 16. Motor load | maximum, average | 1 minute |
| 17. Voltage phase imbalance | maximum, average | 1 hour |
| 18. Stator condition | maximum, average | 1 hour |
| 19. Rotor condition | maximum, average | 1 hour |
| 20. Subharmonic vibration | maximum, average | 1 hour |
| 21. 1X vibration | maximum, average | 1 hour |
| 22. 2X vibration | maximum, average | 1 hour |
| 23. Harmonic vibration 3X–8X | maximum, average | 1 hour |

TABLE 1-continued

| PARAMETER | MEASUREMENT | ACQUISITION INTERVAL |
|---|---|---|
| 24. Harmonic vibration >8X | maximum, average | 1 hour |
| 25. Non-harmonic vibration 1X–8X | maximum, average | 1 hour |
| 26. Non-harmonic vibration >8X | maximum, average | 1 hour |
| 27. HFD | maximum, average | 1 hour |
| 28. Overall vibration | maximum, average | 1 hour |
| Maintenance Log Parameters | | |
| 29. Lubrication date/time | | As performed |
| 30. Alignment date/time | | As performed |
| 31. Bearing change date/time | | As performed |
| 32. Flux spectrum 1600 lines | Last 12 months (one/month) | 1 hour |
| 33. Vibration spectrum, 400 lines, 300 Hz | Last 52 weeks (one/week) | 1 hour |
| 34. Vibration spectrum, 800 lines, 2500 Hz | Last 12 months (one/month) | 1 hour |
| For Variable Frequency Motors | | |
| 35. RPM cumulative time <50% max rating | 180 days, 60 months, life | 1 minute |
| 36. RPM cumulative time 50–100% max rating | 180 days, 60 months, life | 1 minute |
| 37. RPM cumulative time >100% max rating | 180 days, 60 months, life | 1 minute |
| 38. RPM | maximum, average | 1 minute |

Table 1 is divided into four categories of parameters—motor life, trend, maintenance, and variable frequency motor parameters. Each parameter is measured frequently and stored in a daily and monthly buffer. The maximum and average levels for certain parameters are stored daily and kept for 180 days in a circular buffer. Each average and maximum parameter value is stored monthly in the EEPROM 142 and saved for 60 months (5 years). Some parameters are stored as the cumulative value over defined intervals, including intervals of 180 days, 60 months, and lifetime.

For example, for the motor life parameters (parameters 1–12), the cumulative value of each parameter is stored for the last 180 days, the last 60 months, and life. For trend parameters (parameters 13–28), each parameter is stored once per day for the last 180 day period and once per month for the last 60 month period.

In the circular data buffers, as new data is acquired, the oldest data in the cycle is deleted. For example, in the circular buffer for "motor frame temperature", when the data for the 61st month is acquired, it overwrites the data for the first month. Therefore, to maintain a complete historical record of this parameter, data relating to motor frame temperature should be downloaded from the monitor 100 and placed in long term electronic storage at least once every 60 months.

As Table 1 indicates, information pertaining to motor maintenance may be input and stored in the monitor 100. A record of all maintenance activity on the motor 102 can be entered through an external device, such as a CSI™ 2110 data collector, and stored in the monitor 100. Maintenance information includes the time and date of lubrication, machine alignment, and bearing replacements.

Data and information is transmitted to and from the monitor 100 through a communications port 154 (FIGS. 4 and 5), which is preferably a serial infrared (IR) data link. The lid 110b is fabricated from an IR transmissible material, such as a polycarbonate material, so that communications port 154 can be protected within the monitor's housing 110. Communications port 154 provides an interface for communicating with an external device, such as a portable data collector or notebook computer, via infrared data link to enable the history information to be downloaded. The portable data collector or notebook computer may also be used to program, or download programs to, the monitor 100. For the parameters given in Table 1, data would need to be downloaded at least every 180 days to avoid loss of any data. In other applications, the circular data buffers may be designed with longer or shorter circular lives. The downloaded information can be further analyzed to provide an indication of the remaining useful life of the motor 102 and to diagnose problems.

At least two options are available for collecting stored data. In one option, a portable data collector is used as a data gatherer only, with no data display capability. The data is simply moved from the monitor 100 to a base computer for analysis and archival. Another option for data collection utilizes a full Windows™ compatible pad computer running the necessary data analysis software. The pad computer should be rugged enough to analyze and display motor parametric data in the field.

In a preferred embodiment, all electrical power for the monitor 100 is provided by one or more dc batteries 144, such as two replaceable, D cell, Alkaline batteries 144 as previously discussed with respect to FIG. 4. Power consumption is kept to a minimum in the interest of prolonging battery life to at least two years. Microcomputer 170, which in a preferred embodiment is an 8-bit microcomputer manufactured by Toshiba, minimizes power consumption by employing a power saving sleep mode where the microcomputer 170 remains idle, or sleeps most of the time. The microcomputer 170, which includes a clock for maintaining time and date and for measuring elapsed time for certain parameters, awakes periodically, such as every 5 seconds, and checks the motor ON/OFF status. If the motor 102 is ON, the monitor 100 checks the overall amplitude measurements (load, temperature, and vibration) every 2 minutes, all measurements derived from FFT calculations once per hour, and starts per day are counted. If the motor 102 is OFF, no data is stored and the monitor 100 is set to capture the acceleration time upon start-up.

Other sources of electrical power suitable for use within the monitor 100 are available. For example, the D cell Alkaline batteries of the preferred embodiment could be replaced with a Peltier device. This type of device includes a material which, when heated on one side and cooled on the other, produces electrical power. The larger the temperature differential, the more power that the device is able to produce. The Peltier device would take advantage of motor heat to elevate the temperature of the hot side of the device, while ambient cooling would be used to reduce the temperature of the cold side. As another alternate source of power, a 120 volt power line can be connected to the monitor 100.

During operation of an electric motor 102, heat generated by the motor is typically transferred by the motor frame 104 to the ambient air, creating a heat blanket that surrounds the motor frame 104. A heat blanket may also result from external factors, such as heating induced by absorption of sunlight. Under certain conditions with some motors, this heat blanket can be large enough to adversely effect the accuracy of the ambient temperature sensor 122 and significantly reduce battery life. Heat generated by the motor 102 and external factors is also conducted from the frame 104 and surrounding ambient air to the monitor 100.

To reduce adverse effects of elevated temperature on temperature sensitive equipment such as the ambient temperature sensor 122 and batteries 144, such equipment is preferably located on shelf 128 shown in FIG. 4 As seen in FIG. 4, shelf 128 is elevated by the bucket 110*a* so that equipment located on the shelf 128 is largely if not totally removed from the motor's heat blanket. The bucket 110*a* itself, being fabricated from a low thermally conductive material, also functions in a lesser capacity to shield convective heat from the ambient temperature sensor 122 and batteries 144.

As discussed above, life history parameters are stored in memory 142 where they can be accessed and downloaded via communications port 154. To determine these parameters, microcomputer 170 utilizes signals generated by the sensors 120–126. Some of the sensor signals are utilized by the microcomputer 170 with little or no conditioning of the signals, while other sensor signals receive some amount of conditioning by the signal conditioning circuitry 141, including amplification and frequency filtering, before microcomputer 170 uses them. For example, to determine "run time", the output of flux board 124 may be used directly by microcomputer 170 as an indication that the motor 102 is operating. To ensure the flux signal has sufficient strength, it is first amplified and frequency filtered as needed by the signal conditioning circuitry 141 before it is received by the microcomputer 170. The microcomputer's internal clock is used to maintain a count of the total hours during which magnetic leakage flux is being generated by the motor 102. In this manner, the life history parameter of "run time" shown in Table 1 is determined. Alternatively, the outputs of frame temperature sensor 120 and accelerometer 126 may be utilized as indications of when the motor 102 is operating.

As other examples of life history parameters that are determined directly from sensor outputs, consider the parameter of "maximum motor frame temperature". To determine this parameter, microcomputer 170 compares the current frame temperature sensor output on line 176 to the previous maximum frame temperature. The stored maximum frame temperature is replaced by the current frame temperature when the current frame temperature exceeds the stored maximum. Similarly, the parameter labeled "starts" is determined directly from measured flux, or if preferred, it may be determined by monitoring temperature and vibration. When both exceed a selected threshold, a "running" condition is assumed. When either falls below its threshold, a "stopped" condition is assumed.

To determine the three "motor heating time" parameters, microcomputer 170 subtracts ambient temperature from the frame temperature to arrive at a motor heating temperature. Total motor run time at each of the low, mid, and high heating levels identified in Table 1 is then determined from the microcomputer's internal clock.

The analog output of flux board 124 is received from line 172 and amplified before being used by the microcomputer 170. As previously stated, microcomputer 170 uses a signal representative of magnetic flux produced by the motor 102 to ascertain when the motor 102 is operating. The analog output of vibration transducer 126, which represents vibration in the acceleration domain, is received by the signal conditioning circuitry 141 from line 174 where the vibration signal is preferably amplified, frequency filtered, and integrated. The conditioned vibration signal is then provided to microcomputer 170 for storage and/or analysis. For example, in a preferred embodiment the microcomputer 170 is programmed to transform sensor signals such as vibration and flux from the time domain to the frequency domain by means of a Fourier transform or a fast Fourier transform, producing spectral data. Integration of the vibration signal to the velocity domain may also be performed by the microcomputer 170.

Following an analog-to-digital conversion, the velocity domain vibration signal is used by the microcomputer 170 to determine the various vibration parameters identified in Table 1. Preferably, the "maximum vibration" is the maximum vibration measured in velocity units, but alternately, velocity may be integrated to obtain vibration measured in displacement units and the maximum displacement is, in this alternate embodiment, stored as the "maximum vibration". Motor speed can be determined from a Fourier transform, preferably a high resolution FFT of the digitized vibration signal. Preferred methods of determining motor speed from vibration spectral data are disclosed in U.S. Pat. No. 5,744,723 entitled METHOD FOR DETERMINING ROTATIONAL SPEED FROM MACHINE VIBRATION DATA, the entire contents of which are expressly incorporated herein by reference. The difference between actual speed and synchronous speed at no load is used to determine motor load.

Processed sensor signals are also analyzed by the microcomputer 170 in accordance with programming that has been loaded into memory 142 to determine the status or operating condition of the motor 102. As previously described, significant information regarding the motor's operating condition can be determined by analysis of the sensor signals. For example, flux signals produced by flux board 124 are analyzed by the microcomputer 104 to determine motor conditions such as running or stopped status as well as motor speed and load. By performing a high resolution fast Fourier transform (FFT) of the flux signals and analyzing data represented by the resulting flux spectra, the microcomputer 170 determines when the motor 102 is experiencing anomalies such as voltage phase imbalance, stator turn-to-turn shorts, and rotor bar failures. Voltage phase imbalance, stator condition, and rotor condition are determined from flux as relative, trendable parameters. In addition, by obtaining a current measured spectrum for the motor 102 at full load, a calibration and severity indication of these relative values can be determined. Exemplary analysis techniques for determining the condition of electric machines are also described in U.S. Pat. No. 5,739,698 entitled MACHINE FAULT DETECTION USING SLOT PASS FREQUENCY FLUX MEASUREMENTS, the entire contents of which are expressly incorporated herein by reference.

As described above, the outputs of the motor frame temperature sensor 120 and the vibration sensor 126 are analyzed by the microcomputer 170 to determine when machine heating is at an abnormal level and when mechanical faults are present. Exemplary vibration analysis techniques (including analysis of vibration spectra) are described in U.S. Pat. No. 5,895,857 entitled MACHINE FAULT DETECTION USING VIBRATION SIGNAL PEAK DETECTION, and in U.S. Pat. No. 5,943,634 entitled VIBRATION DATA ANALYSIS BASED ON TIME WAVEFORM PARAMETERS, the entire contents of which are expressly incorporated herein by reference.

Figure 9:
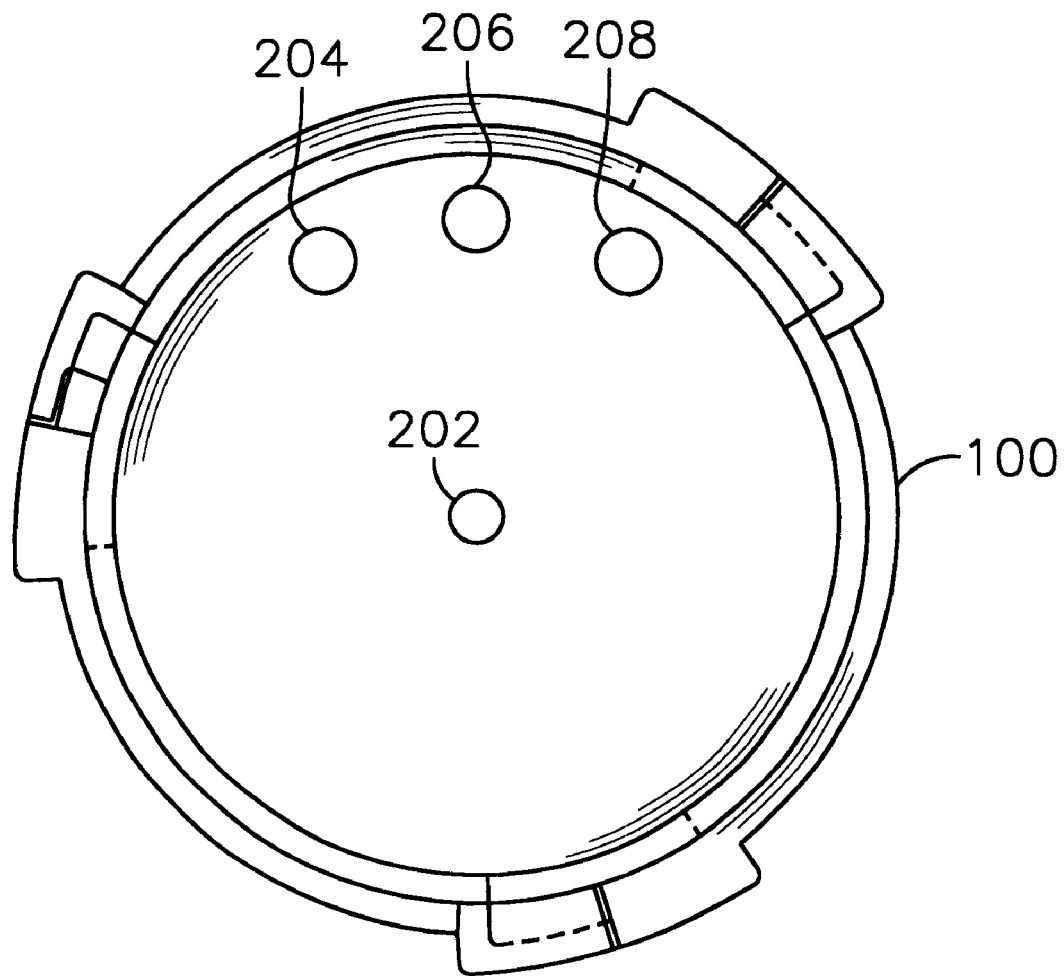
FIG. 9 is a top view of a monitor in accordance with the present invention, showing external features of the monitor including visual status indicators.

Also described above, the monitor 100 monitors one or more operating parameters of the motor 102 to determine the motor's operating condition. One or more sensors and associated electronics, as described above, sense and analyze various machine operating characteristics to detect the presence or absence of anomalous motor conditions. FIG. 9 illustrates an embodiment of the invention in which the detected condition of the motor 102 is visually indicated to machine operators. Alternatively, the detected condition of the motor 102 is indicated aurally to machine operators, or both visually and aurally.

In a preferred embodiment, an anomalous motor operating condition is visually indicated by a single blinking light 202. When the light 202 is off and not blinking, machine operators know that the motor 102 is operating normally. When the light 202 is blinking, machine operators are alerted to the presence of an anomalous motor operating condition.

In an alternate embodiment, the condition of the motor 102 is visually indicated by colored LEDs, also shown in FIG. 9, so that machine operators and plant maintenance personnel can determine the operating condition of the motor 102 by a simple glance at the monitor 100. As shown in FIG. 9, the colored LEDs include a green LED 204 for indicating that no machine anomalies have been detected, a yellow LED 206 for indicating that an intermediate fault or anomaly not requiring immediate attention has been detected, and a red LED 208 for indicating critical faults or anomalies requiring immediate attention or repair. Thus, the LEDs 204–208 provide machine operators with a visual indication of the condition of the motor 102, including whether or not a motor anomaly is present and, if so, the severity of that anomaly.

When the green LED 204 indicates that the motor 102 is healthy and there are no anomalous conditions, there is typically no need to collect vibrational or other data to ascertain the operating condition of the motor 102. The particular data collection methodology employed will, of course, dictate the frequency and extent of data collection when the motor 102 is known to be healthy, but as a general principal there is no need to collect data when a simple glance at the monitor 100 tells the machine operator whether the motor 102 is healthy or unhealthy. However, when the motor 102 is in alarm as indicated by a blinking, yellow, or red light, data stored in the monitor's memory 142 should be downloaded and further analyzed at a base computer to determine the cause of the alarm condition. Thus, indicators 202–208 can be used to significantly reduce manpower and other costs that would otherwise be incurred to monitor the health and condition of the motor 102.

Figure 6:
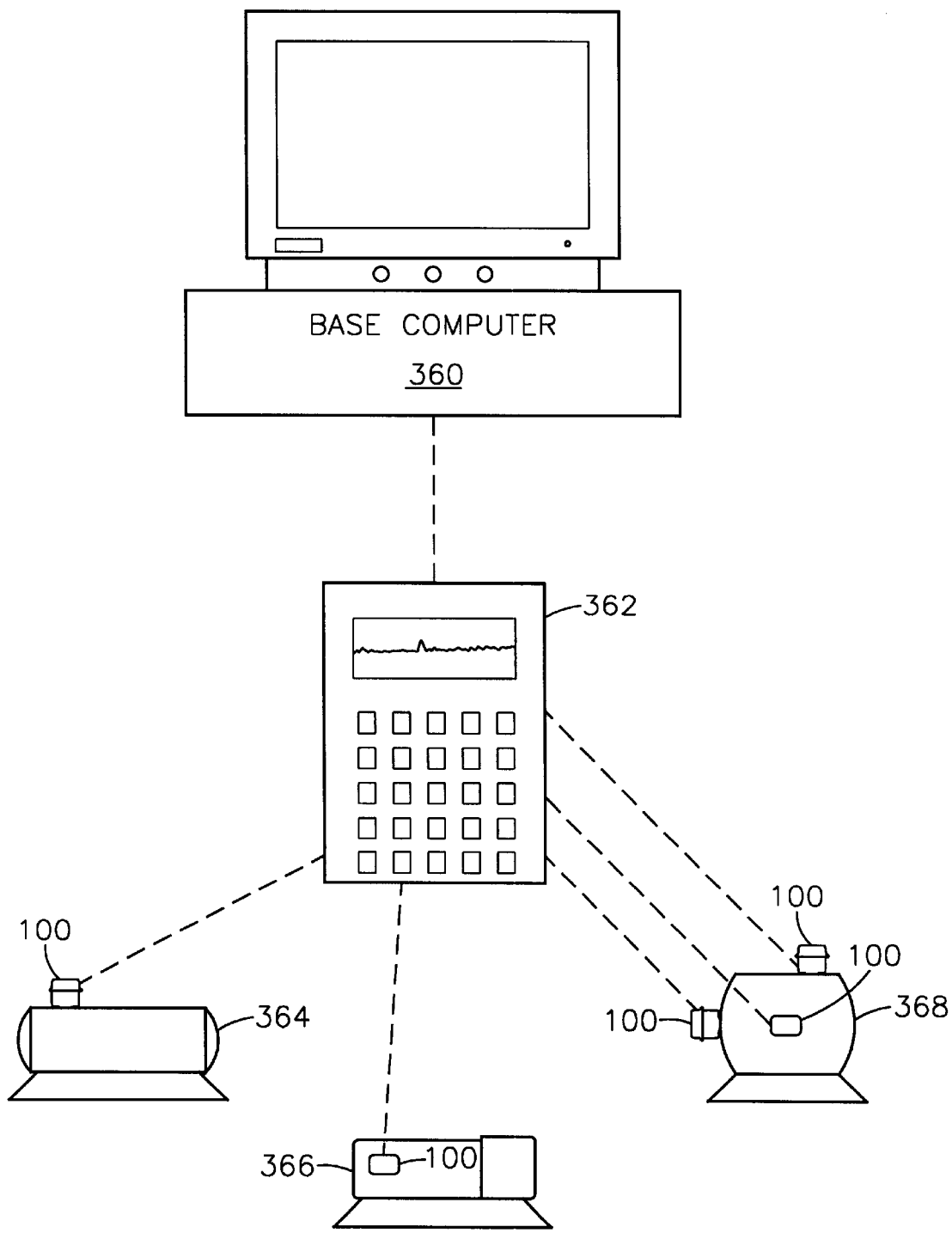
FIG. 6 is a diagrammatic drawing illustrating a monitoring system that employs a portable data collector to periodically download data stored by various monitors and transfer the downloaded data to a base computer for processing and analysis.
Figure 10:
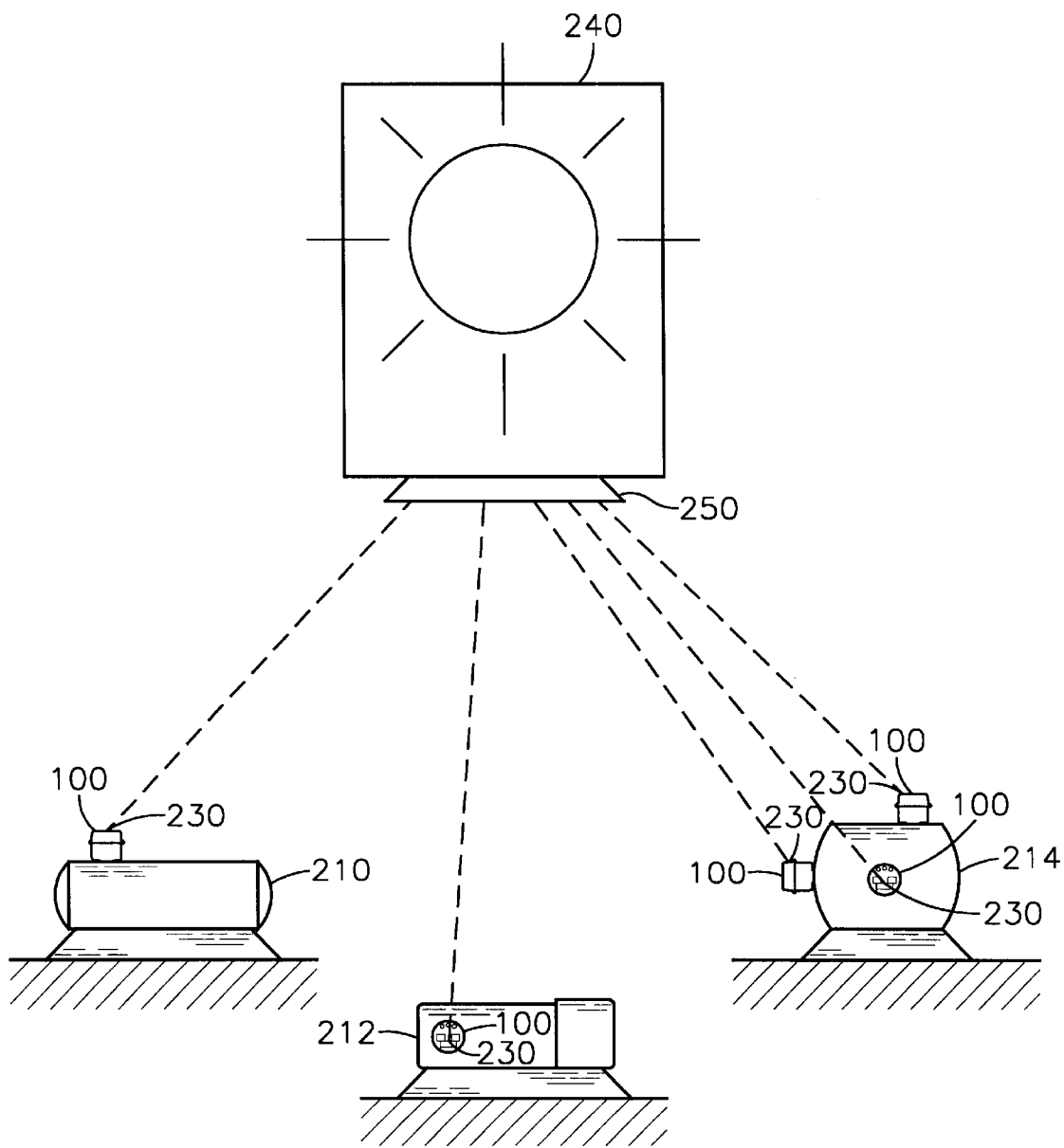
FIG. 10 is a diagrammatic drawing showing a monitoring system in which several monitors are equipped with rf transmitting antennas for transmitting rf signals to a visual annunciation device to alert machine operators when an anomalous machine operating condition exists.

To further illustrate the monitor's 100 versatility and adaptability, FIG. 10 shows an embodiment of the invention where an RF transmitter/antenna 230 is incorporated into several monitors 100 to send out a wireless alarm signal when the monitor 100 determines the presence of an anomalous motor condition. The wireless alarm signal is received by an annunciation device 240 (preferably a light with an RF receiver 250) mounted near a commonly accessed area of the facility, such as a walkway, to visually alert personnel that a motor is in alarm. When an alarm is generated, the preferred procedure for diagnosing the cause of the alarm includes downloading data stored in the monitor 100 with a peripheral device so that the data can be more readily analyzed at a base computer 360 (FIG. 6).

Wireless signals transmitted by the RF transmitter/antenna 230 may simply indicate the existence of a general fault condition. In a preferred embodiment, however, information relating to fault severity is also transmitted by the RF transmitter/antenna 230. When wireless signals transmitted by the monitor 100 correspond to fault severity, the annunciation device 240 annunciates not only the existence of a fault condition, but also the severity of that fault condition as represented by the wireless signal.

For example, an intermediate type fault may be indicated by a wireless signal that causes the annunciation device 240 to remain continuously lit, while a more severe fault is indicated by rapidly strobing the annunciation device 240. In this manner, the annunciation device 240 indicates the presence of an anomalous machine operating condition as well as a general measure of the severity of the machine fault.

A significant advantage of a monitor 100 capable of visually indicating the operating condition of the motor 102 is that the monitor 100 can be employed to conveniently monitor motors with special problems. Such special problems include motors which are known to have an operating anomaly, such as a motor with a known latent fault condition which could eventually grow into a more severe problem. For such motors, the monitor 100 is preferably programmed to monitor the motor's status at increased intervals. Another special motor problem involves motors which are difficult or hazardous for maintenance personnel to access. Such motors can be easily and safely monitored with a monitor 100 having a visual indicator.

During initial installation and setup of the monitor 100, the monitor 100 is setup for the particular motor 102 on which it is installed. During this installation mode, a peripheral device such as a notebook computer or portable data collector is connected to the monitor 100 via the communications port 154 for programming, or training. Various settings and adjustments are made to the monitor 100 during setup, including full load speed, number of poles, motor identification, and others.

Once installation and training are completed, operation of the monitor 100 is completely self-contained and maintenance-free. As previously described, the monitor's internal battery 144 and electronics are configured to operate for at least two years before battery power is depleted. Data stored in the memory 142 should be periodically downloaded, at least once every six months, and analyzed to determine the health and operating condition of the motor 102. When life-extending maintenance is performed on the motor 102, that maintenance information should be input to the monitor 100.

In a typical industrial facility, tens or even hundreds of electrical machines may exist. As FIG. 6 illustrates, the present invention provides plant personnel with a convenient system for monitoring each machine. Illustrated in FIG. 6 are three electric motors 364, 366, and 368 onto which monitors 100 have been attached. A peripheral device, such as CSI™ 2120 portable data collector 362, is used to periodically download data stored in each of the monitors' memory 142. After all downloading of data is completed, the collected data is transferred to a base computer 360 for analysis and archival. Alternatively, the data collector 362 may be programmed to analyze the downloaded data on site to provide a quick determination of the operating condition of a particular motor. As described previously herein, a further function of the data collector 362 is to program, or download programs from, the monitors 100.

Figure 7:
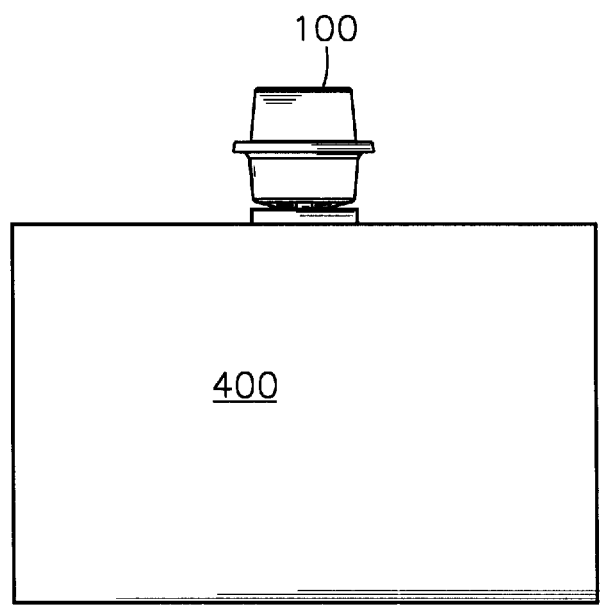
FIG. 7 is a side view showing a monitor of the present invention attached to a pump.

For machines other than electric motors, the monitor 100 may be configured slightly differently than described above since the specific factors which affect the life of a machine may vary based on the type of machine that is being monitored. For example, as shown in FIG. 7, the monitor 100 is attached to a pump 400 to monitor the pump's operating condition. Depending on the type and amount of data that is desired, a single sensor or a plurality of sensors may be employed to monitor the pump's operating condition. Since a high percentage of potential faults within the pump 400 are detectable from vibration, a preferred embodiment of the monitor 100 of FIG. 7 includes a single vibration sensor with no flux or temperature sensors. Vibration produced by the pump 400 is sensed by the monitor 100 and processed, recorded, and/or analyzed as described above to ascertain the health and condition of the pump.

Figure 8:
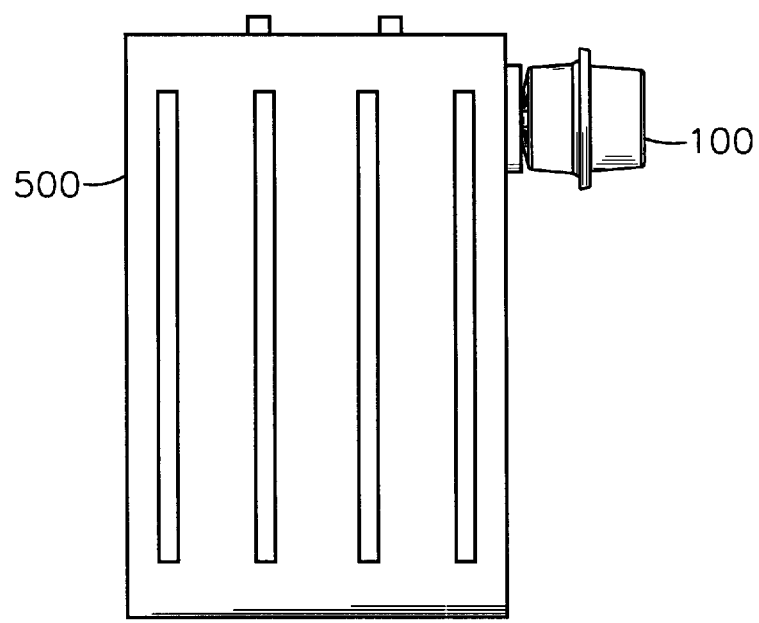
FIG. 8 is a side view showing a monitor of the present invention attached to a transformer.

As shown in FIG. 8, the monitor 100 can be employed to monitor the operating condition of a transformer 500 by attaching the monitor 100 on or near the transformer 500. Flux produced by the transformer 500 can be sensed by the monitor 100 and analyzed to ascertain many faults which are typically experienced by transformers, whereas vibration produced by the transformer provides little useful information for ascertaining the condition of the transformer 500. Accordingly, the monitor 100 of FIG. 8 preferably includes only a single flux sensor with no vibration or temperature sensors. If additional data is desired, the monitor 100 may further include a temperature sensor for monitoring the transformer's temperature.

It is contemplated, and will be apparent to those skilled in the art from the foregoing specification, drawings, and examples that modifications and/or changes may be made in the embodiments of the invention. Accordingly, it is expressly intended that the foregoing are illustrative of preferred embodiments only, not limiting thereto, and that the true spirit and scope of the present invention be determined by reference to the appended claims.

What is claimed is:

1. A monitor for being placed in sensory contact with a machine for monitoring the operation of the machine and producing an operation history, said monitor comprising:
   a structural enclosure;
   an engagement surface formed on said enclosure;
   a fastener for attaching said engagement surface to a mount proximate said machine so that said engagement surface is in sensory contact with the machine;
   a power supply for supplying electrical power to the monitor;
   a sensor disposed in said enclosure for sensing an operating parameter of the machine and producing sensor signals representative of the operating parameter that was sensed;
   a signal processor disposed in said enclosure for receiving, processing, and analyzing said sensor signals to produce sensor data corresponding to the operating status of the machine, and producing an alarm signal when the analysis of said sensor signals indicates the existence of an anomalous machine condition;
   an indicator for receiving alarm signals and producing a humanly perceivable indication of an anomalous machine condition when an alarm signal is received; and
   memory for storing sensor data, said stored sensor data corresponding to the operation history of the machine.

2. The monitor of claim 1 wherein said signal processor is further operable to perform a fast Fourier transform of said sensor signals to produce machine operating data in the form of spectra, said processor being further operable to analyze said spectra to determine the condition of the machine.

3. The monitor of claim 1 wherein said indicator includes a visual indicator for providing a visual indication corresponding to the operating condition of the machine based on the presence or absence of alarm signals.

4. The monitor of claim 3 wherein said visual indicator is further operable to provide a visual indication of the severity of anomalous machine conditions.

5. The monitor of claim 4 wherein said visual indicator includes:

a yellow illumination element for visually indicating the presence of an intermediate level machine fault condition which does not require immediate attention; and
a red illumination element for visually indicating the presence of a critical machine fault condition requiring immediate attention.

6. The monitor of claim 1, further comprising a communications module formed in said housing to enable the monitor to communicate with a peripheral device.

7. The monitor of claim 6 wherein said communications module includes an infrared communications module.

8. The monitor of claim 6 wherein said communications module includes an RF communications module for wirelessly communicating with the peripheral device.

9. The monitor of claim 1 wherein said fastener includes:
   a threaded stud attached to the outer surface of the machine; and
   a recess formed in said housing and threaded to receive said stud so that when the recess and stud are adjacent each other, rotation of the monitor in a first direction attaches the monitor to the stud and rotation of the monitor in a second direction which is opposite to said first direction disengages the monitor from the stud.

10. The monitor of claim 1 wherein said sensor includes a vibration sensor for sensing machine vibration.

11. The monitor of claim 1 wherein said sensor includes a temperature sensor for sensing machine temperature.

12. The monitor of claim 1 wherein said sensor includes a flux sensor for sensing an electrical characteristic of said machine.

13. The monitor of claim 1 wherein said power supply includes a dc power source disposed in said enclosure.

14. The monitor of claim 1, further comprising a wireless transmitter for transmitting wireless alarm signals when an anomalous machine condition is detected, said indicator being remote from said monitor and including a receiver for receiving wireless alarm signals and annunciating alarm conditions through humanly perceivable indications.

15. A machine fault detection and indicator system for monitoring the operating condition of a plurality of machines and indicating to personnel when one or more anomalous machine conditions are detected, the system comprising:
   for each of said plurality of machines, at least one monitor permanently attached to the machine for sensing and analyzing an operating characteristic of the machine, producing an alarm signal when an anomalous machine operating characteristic is sensed, and producing a humanly perceivable indication of an anomalous condition when an alarm signal is produced, said at least one monitor including;
   a housing;
   a fastener for attaching said housing to the exterior surface of a machine;
   a sensor disposed within said housing for sensing an operating characteristic of the machine and producing sensor signals representative of the operating characteristic that was sensed;
   a signal processor disposed in said housing for receiving, processing, and analyzing said sensor signals to determine the operating status of the machine, and producing an alarm signal when the analysis of said sensor signals indicates the existence of an anomalous machine condition; and
   an indicator for receiving alarm signals and producing a humanly perceivable indication of an anomalous machine condition when an alarm signal is received; and
   a peripheral device for obtaining machine operating data from a monitor when an anomalous machine condition is indicated.

16. The system of claim 15 wherein each of said monitors includes a wireless transmitter for transmitting a wireless signal when an anomalous machine condition is detected, said system further including an annunciation device for receiving a wireless signal transmitted by a monitor and indicating the presence of an anomalous machine condition when a wireless signal is received.

17. The system of claim 16 wherein said wireless signal corresponds to the severity of the anomalous condition, and wherein said annunciation device indicates fault severity as represented by wireless signals transmitted by said wireless transmitter.

18. The system of claim 15 wherein each of said monitors includes a memory for storing operating characteristics of the machine, said machine operating data being obtained by the peripheral device from data stored in a monitor.

19. The system of claim 15 wherein said peripheral device includes a sensor for obtaining the machine operating data.

20. The system of claim 15, further comprising a base computer for receiving and analyzing the machine operating data to determine an anomalous machine condition which contributed to the alarm signal.

* * * * *